United States Patent
Oonuki et al.

(10) Patent No.: US 7,630,269 B2
(45) Date of Patent: Dec. 8, 2009

(54) SEMICONDUCTOR NON-VOLATILE MEMORY, DATA-WRITING METHOD, SEMICONDUCTOR NON-VOLATILE MEMORY FABRICATION METHOD, AND DATA-WRITING PROGRAM STORAGE MEDIUM

(75) Inventors: Kenji Oonuki, Tokyo (JP); Narihisa Fujii, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 93 days.

(21) Appl. No.: 11/756,815

(22) Filed: Jun. 1, 2007

(65) Prior Publication Data
US 2008/0062801 A1 Mar. 13, 2008

(30) Foreign Application Priority Data
Sep. 12, 2006 (JP) .............................. 2006-247103

(51) Int. Cl.
*G11C 5/14* (2006.01)
(52) U.S. Cl. .............. 365/226; 365/185.03; 365/189.16
(58) Field of Classification Search ................ 365/226, 365/189.16, 148, 158, 163
See application file for complete search history.

(56) References Cited

U.S. PATENT DOCUMENTS

| 5,959,882 | A | 9/1999 | Yoshida et al. |
| 7,211,878 | B2 | 5/2007 | Ono |
| 2005/0002236 | A1* | 1/2005 | Morikawa et al. ...... 365/185.14 |
| 2005/0002263 | A1* | 1/2005 | Iwase et al. ........... 365/230.03 |

FOREIGN PATENT DOCUMENTS

| JP | 10-027486 | 1/1998 |
| JP | 2005-064295 | 10/2005 |

* cited by examiner

*Primary Examiner*—Anh Phung
*Assistant Examiner*—Tha-O Bui
(74) *Attorney, Agent, or Firm*—Volentine & Whitt, P.L.L.C.

(57) ABSTRACT

A semiconductor non-volatile memory, a data-writing method, a semiconductor non-volatile memory fabrication method and a medium storing a data-writing program that are capable of suppressing a change, due to an operation of memorization of data to a charge accumulation portion, in data which has been memorized at another charge accumulation portion in the same memory cell. Data units which are objects of memorization are memorized to first and second charge accumulation portions of a memory cell by power being supplied in accordance with the data units and charges being accumulated at the first and second charge accumulation portions, in descending order of sizes of charge amounts that are to be accumulated.

13 Claims, 11 Drawing Sheets

# SEMICONDUCTOR NON-VOLATILE MEMORY, DATA-WRITING METHOD, SEMICONDUCTOR NON-VOLATILE MEMORY FABRICATION METHOD, AND DATA-WRITING PROGRAM STORAGE MEDIUM

CROSS-REFERENCE TO RELATED APPLICATION

This application claims priority under 35 USC 119 from Japanese Patent Application No. 2006-247103, the disclosure of which is incorporated by reference herein.

BACKGROUND OF THE INVENTION

1. Field of the Invention

The present invention relates to a semiconductor non-volatile memory, a data-writing method, a semiconductor non-volatile memory fabrication method and a data-writing program storage medium, and more particularly relates to a semiconductor non-volatile memory in which charge accumulation portions capable of memorizing pluralities of bits of data in accordance with charge amounts that are accumulated thereat are plurally provided in a memory cell, a method for writing data to the semiconductor non-volatile memory, a method for fabricating the semiconductor non-volatile memory, and a medium storing a program for writing data to the semiconductor non-volatile memory.

2. Description of Related Art

Heretofore, in a flash memory which is provided with floating gates (charge accumulation portions) corresponding one-to-one with memory cells, two bits of data can be memorized at a single memory cell by varying a charge amount that is accumulated at the floating gate. In such a case, when writing to one memory cell is being carried out, other, adjacent memory cells which share a word line therewith are lightly written. In order to counter this "word line disturbance" problem, Japanese Patent Application Laid-Open (JP-A) No. 10-27486 has disclosed a technology which performs sequential writing starting from the memory cells that require the heaviest writing.

Meanwhile, JP-A No. 2005-64295 has disclosed a semiconductor non-volatile memory in which two charge accumulation portions are provided at each memory cell.

In recent years, memorizing four bits of data at one memory cell by memorizing two bits of data at each of the charge accumulation portions of a semiconductor non-volatile memory in which two charge accumulation portions are provided at each memory cell has been attempted, as disclosed in JP-A No. 2005-64295.

However, when memorization of two bits of data at each charge accumulation portion of a memory cell is tried, there is a problem, in addition to the above-mentioned word line disturbance problem, in that when writing to one of the charge accumulation portions in a single memory cell is being carried out, the other charge accumulation portion is also lightly written and a data unit that is memorized at the other charge accumulation portion may be altered.

This problem is not limited to semiconductor non-volatile memories in which two charge accumulation portions are provided at each memory cell but is also a problem for semiconductor non-volatile memories in which three or more charge accumulation portions are provided at each memory cell.

SUMMARY OF THE INVENTION

The present invention has been devised in order to solve the problem described above, and an object of the present invention is to provide a semiconductor non-volatile memory, a data-writing method, a semiconductor non-volatile memory fabrication method and a medium storing a data-writing program that are capable of suppressing a change in date memorized at a charge accumulation portion to an operation of memorization of data at another charge accumulation portion in the same memory cell.

In order to achieve the object described above, according to a first aspect of the present invention, there is provide a non-volatile semiconductor memory including: a memory cell at which a charge accumulation portion capable of accumulating charge is plurally provided; a power supply section that supplies power in accordance with each of data units of pluralities of bits, which data units are respective objects of memorization at the charge accumulation portions, and causes the each data unit to be memorized by charge being accumulated at the respective charge accumulation portion in a charge amount corresponding to the data unit; and a control section that controls the power supply section such that the data units are memorized at the charge accumulation portions in descending order of the charge amounts to be accumulated.

In the semiconductor non-volatile memory of the first aspect of the present invention, the charge accumulation portion capable of accumulating charge is plurally provided at the memory cell. Power is supplied by the power supply section in accordance with the plural-bit data unit that is a corresponding memorization object for each charge accumulation portion, and the data unit is memorized by accumulating charge to the charge amount corresponding to the data unit at the charge accumulation portion.

In the present invention, the power supply section is controlled such that data is memorized at the charge accumulation portions in descending order of sizes of the charge amounts that are to be accumulated.

According to the first aspect of the present invention as described above, electric power is supplied to the charge accumulation portions of the memory cell in descending order of charge amounts to be accumulated in accordance with the plural-bit data units which serve as respective memorization objects, and data is memorized by charges being accumulated at the charge accumulation portions in the charge amounts corresponding to the data units. Thus, the later in the sequence a data unit is memorized, the smaller the power that is supplied to the memory cell for memorizing that data unit at the charge accumulation portion, and thus the smaller an amount of increase of charge that occurs at another charge accumulation portion in the same memory cell. Therefore, a change, due to a data memorization operation to a charge accumulation portion, in data that has been memorized at another charge accumulation portion in the same memory cell can be suppressed.

The control section of the present invention may control the power supply section such that, for a data unit that is earlier in the order of memorization, a charge amount that is accumulated at the charge accumulation portion is smaller than the charge amount corresponding to the data unit.

Furthermore, the control section of the present invention may control the power supply section such that when one of the data units is being memorized to the respective charge accumulation portion, a charge amount that is accumulated at the respective charge accumulation portion is reduced by an amount corresponding to an increase in the charge amount due to another of the data units subsequently being memorized.

Furthermore, if the data units to be memorized at the respective charge accumulation portions are the same as one another, the control section of the present invention may control the power supply section such that the data units are memorized in a pre-specified order with a charge amount being smaller for a data unit that is earlier in the order.

Further, in order to achieve the object described above, according to a fifth aspect of the present invention, there is provided a non-volatile semiconductor memory including: a memory cell at which a charge accumulation portion capable of accumulating charge is plurally provided; a power supply section that supplies power in accordance with each of data units of pluralities of bits, which data units are respective objects of memorization at the charge accumulation portions, and causes the each data unit to be memorized by charge being accumulated at the respective charge accumulation portion in a charge amount corresponding to the data unit; and a control section that, if the data units to be memorized at the respective charge accumulation portions are the same as one another, controls the power supply section such that the data units are memorized in a pre-specified order with a charge amount being smaller when the data unit that is being memorized is earlier in the order.

According to the fifth aspect of the present invention as described above, if the data units to be memorized to the charge accumulation portions are the same, the data units are memorized in the pre-specified order with a charge amount being set smaller for a data unit that is earlier in this sequence. Therefore, when the matching data units are being memorized to the charge accumulation portions in the pre-specified order, a change, due to a data memorization operation to a charge accumulation portion, in a matching data unit which has been memorized at another charge accumulation portion in the same memory cell can be suppressed.

Furthermore, in order to achieve the object described above, according to a sixth aspect of the present invention, there is a data-writing method including: at respective charge accumulation portions of a memory cell at which a charge accumulation portion capable of accumulating charge is plurally provided, supplying power in accordance with data units of pluralities of bits, which data units are respective objects of memorization at the charge accumulation portions; and accumulating charges at the respective charge accumulation portions in charge amounts corresponding to the data units, for memorizing the data units, in descending order of the charge amounts to be accumulated.

Thus, according to the data-writing method of the sixth aspect of the present invention, operations similar to the invention of the first aspect are performed. Therefore, similarly to the invention of the first aspect, a change due to a data memorization operation to a charge accumulation portion in data that has been memorized at another charge accumulation portion in the same memory cell can be suppressed.

Furthermore, in order to achieve the object described above, according to a seventh aspect of the present invention, there is provided a non-volatile semiconductor memory fabrication method comprising: at respective charge accumulation portions of a memory cell at which a charge accumulation portion capable of accumulating charge is plurally provided, supplying power in accordance with data units of pluralities of bits, which data units are respective objects of memorization at the charge accumulation portions; and accumulating charges at the respective charge accumulation portions in charge amounts corresponding to the data units, for memorizing the data units, in descending order of the charge amounts to be accumulated.

Thus, according to the non-volatile memory fabrication method of the seventh aspect of the present invention, similarly to the invention of the first aspect, a change due to a data memorization operation to a charge accumulation portion in data that has been memorized at another charge accumulation portion in the same memory cell can be suppressed.

Furthermore, in order to achieve the object described above, according to a eighth aspect of the present invention, there is provided a data-writing program storage medium readable by a computer, the storage medium storing a program of instructions executable by the computer to perform a function for controlling data-writing, the function including: at respective charge accumulation portions of a memory cell at which a charge accumulation portion capable of accumulating charge is plurally provided, supplying power in accordance with data units of pluralities of bits, which data units are respective objects of memorization at the charge accumulation portions; and accumulating charges at the respective charge accumulation portions in charge amounts corresponding to the data units, for memorizing the data units, in descending order of the charge amounts to be accumulated.

Thus, according to the data-writing program storage medium of the eighth aspect of the present invention, similarly to the invention of the first aspect, a change due to a data memorization operation to a charge accumulation portion in data that has been memorized at another charge accumulation portion in the same memory cell can be suppressed.

As described above, according to the present invention, power corresponding to plural-bit data units which are respective memorization objects is supplied to respective charge accumulation portions of a memory cell in descending order of charge amounts to be accumulated, and charges are accumulated at the respective charge accumulation portions in charge amounts corresponding to the data units. Thus, the data is memorized. Therefore, there is an excellent effect in that an operation of memorization of data to a charge accumulation portion is suppressed from altering data which has been memorized at another charge alteration portion in the same memory cell.

BRIEF DESCRIPTION OF THE DRAWINGS

Preferred exemplary embodiments of the present invention will be described in detail based on the following figures, wherein.

DETAILED DESCRIPTION OF THE INVENTION

Herebelow, embodiments of the present invention will be described in detail with reference to the drawings.

First Embodiment

Figure 1:
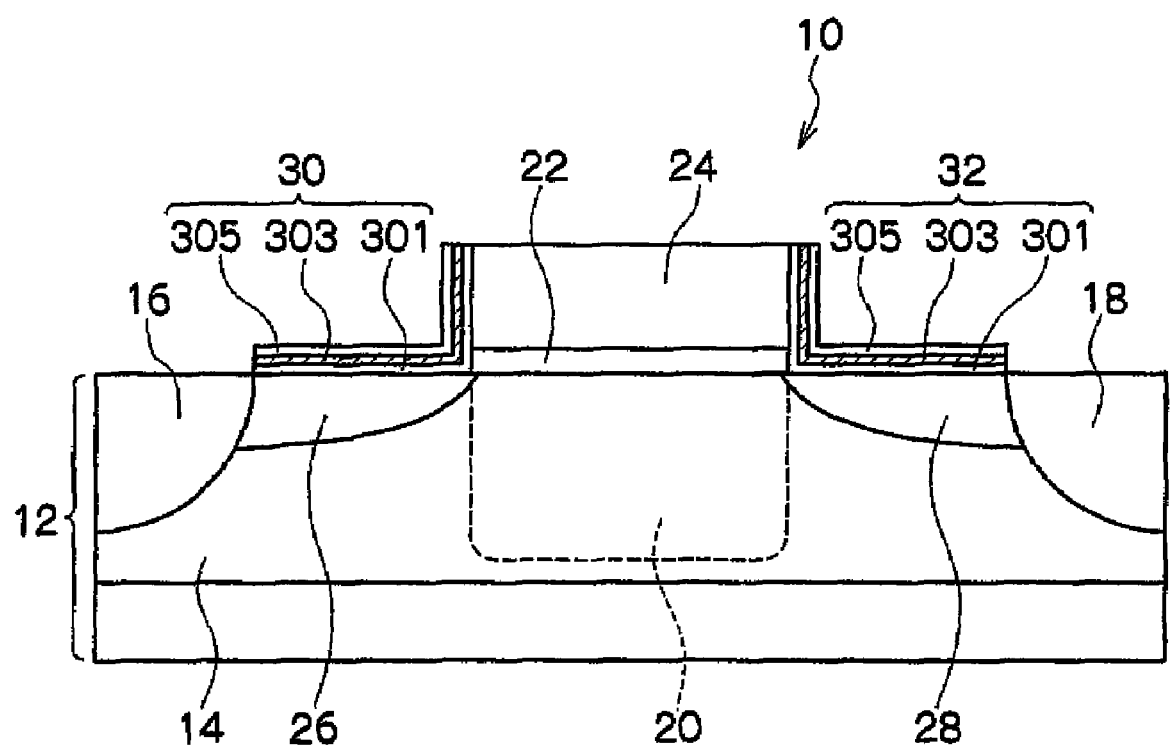
FIG. 1 is a structural diagram showing structure of a memory cell relating to an embodiment.

FIG. 1 is a schematic sectional view showing principal portions of a memory cell 10, which constitutes a semiconductor non-volatile memory relating to the present embodiment.

As shown in FIG. 1, a p-well region 14 is formed at a surface region side of a silicon substrate 12 which serves as a p-type semiconductor substrate. A source region 16 and a drain region 18 are provided with a predetermined separation therebetween. At each of the source region 16 and the drain region 18, an n-type impurity is doped to a high concentration (i.e., n+) into a surface region of the p-well region 14. Metallic electrodes are provided at the source region 16 and the drain region 18, with respective contact layers interposed. The contact layers and metallic electrode layers respectively structure a source electrode and a drain electrode. In the descriptions below, a source region and a drain region are referred to; these are equivalent to the source electrode and the drain electrode, respectively.

A gate electrode 24 is formed on the p-well region 14 at a regional portion sandwiched between the source region 16 and the drain region 18, with a gate insulation layer 22 interposed between the gate electrode 24 and the p-well region 14. A portion of the surface region of the p-well region 14 that is sandwiched by the source region 16 and the drain region 18 acts as a channel formation region 20, at which a channel (flow path) is formed between the source and drain regions during operation of this nMOSFET (n-type metal oxide semiconductor field effect transistor). Herein, the gate insulation layer 22 is a silicon oxide film ($SiO_2$) and the gate electrode 24 is polysilicon (polycrystalline silicon). The nMOSFET structure described above is conventionally known, so will not be described in detail here.

The memory cell 10 is provided with a first resistance variation portion 26, which touches against the source region 16, between the source region 16 and the channel formation region 20. A second resistance variation portion 28, which touches against the drain region 18, is provided between the drain region 18 and the channel formation region 20.

The first and second resistance variation portions (26 and 28) are formed as regions with lower n-type impurity concentrations (i.e., n−) than the respectively corresponding source region 16 and drain region 18. This is in order to cause electric fields to concentrate at edges of the first and second resistance variation portions (26 and 28), in order to selectively inject charges into first and second charge accumulation portions (30 and 32), which will be described later. As a result, hot carriers that are generated can be concentrated in the resistance variation portions. Concentrations and region sizes (widths and depths) of the resistance variation portions can be suitably specified arbitrarily in accordance with objectives and design. Structures of the first and second resistance variation portions (26 and 28) are structures which are substantially similar to an "LDD" (lightly doped drain).

The memory cell 10 is also provided with the first charge accumulation portion 30 on the first resistance variation portion 26 and the second charge accumulation portion 32 on the second resistance variation portion 28.

The first and second charge accumulation portions (30 and 32) are ONO (oxide nitride oxide) laminated insulation films. The ONO laminated insulation films have structures in which a silicon oxide film (first oxide film) 301, a silicon nitride film (SiN) 303 and a silicon oxide film (second oxide film) 305 are sequentially layered onto each of the first and second resistance variation portions (26 and 28), and feature functionality for stable charge accumulation.

Hot carriers which are introduced through the first and second resistance variation portions (26 and 28) described above accumulate in the ONO laminated insulation films, principally at the silicon nitride films 303. In the memory cell 10 relating to the present embodiment, charge amounts that are accumulated at the first and second charge accumulation portions (30 and 32) can be altered, and thus memorization of data of respective pluralities of bits at the first and second charge accumulation portions (30 and 32) is possible. The charge accumulation portions can be suitably selected arbitrarily in accordance with objectives, design and the like of a memory that is to be constituted. For example, an insulation film of one type, or of two or more types, selected from a group of insulation films—silicon nitride films, aluminum oxide films ($Al_2O_3$) and hafnium oxide films ($HfO_x$)—is sandwiched between first and second oxide films, such as silicon oxide films or the like; and structures and the like thereof can be arbitrarily selected. In the present structure, the first and second charge accumulation portions (30 and 32) are formed from on the first and second resistance variation portions (26 and 28) to up side walls of the gate electrode 24, as a result of which accumulation and retention of introduced charges are made consistent. Moreover, because the first and second charge accumulation portions (30 and 32) are provided at both the source region 16 side and the drain region 18 side, writing of data respectively separately to the first and second charge accumulation portions (30 and 32) is possible.

Figure 2:
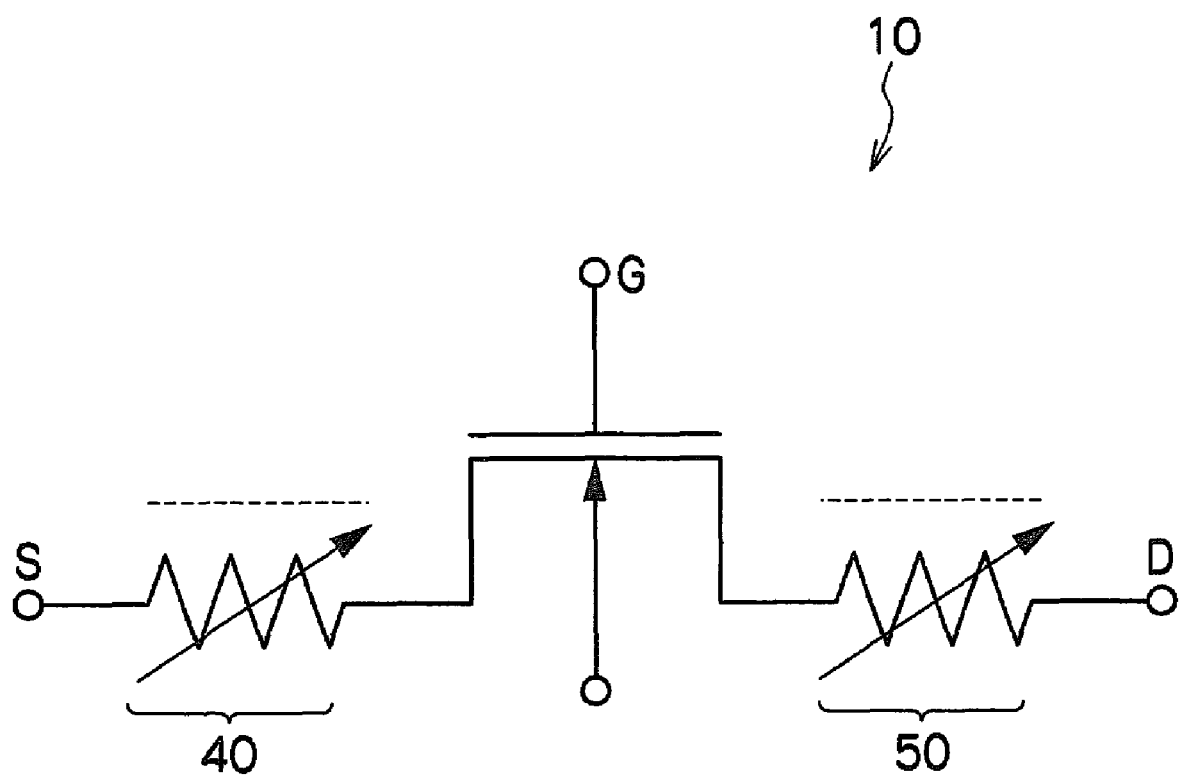
FIG. 2 is a circuit diagram showing an equivalent circuit of the memory cell relating to the embodiment.

An equivalent circuit of the memory cell 10 with the structure described above is shown in FIG. 2. As shown in FIG. 2, in this circuit, a first variable resistor 40 and a second variable resistor 50 are connected to, respectively, the source region (S) and drain region (D) which structure the nMOSFET provided at the memory cell 10.

Next, operations when memorizing data, reading out data and erasing data at the memory cell 10 will be described below, with reference to table 1. Herebelow, as an example, a case in which a two-bit data unit ('00', '01', '10' or '11') is memorized, read and erased at the drain region 18 side of the memory cell 10 will be described. Clearly, when the same operations are to be applied to the source region 16 side, the same operations can be carried out with the voltages listed for the source region and the drain region swapped round.

TABLE 1

|  | Drain | Gate | Source |
| --- | --- | --- | --- |
| Write | +Vdw | +Vgw | 0 |
| Read | 0 | +Vgr | +Vsr |
| Erase | +Vde | 0 or −Vge | Open |

—Process for Memorizing (Writing) Data—

An operation for writing data to the memory cell 10 is performed by, for example, the following process. Here, an initial state is a state in which no charge is accumulated in the charge accumulation portion (herein, this corresponds to a logical value '11').

When writing data to the drain region 18 side, a positive voltage (+Vdw) is applied to the drain region 18, a positive voltage (+Vgw) is applied to the gate electrode 24, and the source region 16 is set to a ground voltage.

In accordance with these conditions, an electric field is concentrated at the edge of the second resistance variation portion 28 which has a lower concentration of n-type impurities than the drain region 18. Hence, the generation of hot electrons which are hot carriers (referred to as high-energy electrons) by impact ionization is efficiently concentrated in the second resistance variation portion 28.

As a result, the hot electrons pass from the second resistance variation portion 28 through an energy barrier of the silicon oxide film 301 and are selectively injected into the second charge accumulation portion 32, and thus writing of data can be implemented. Further, by varying the voltage value +Vdw that is applied to the drain region 18, generated quantities of the hot electrons can be adjusted, and thus a charge amount that is accumulated at the second charge accumulation portion 32 can be adjusted.

The voltage value +Vdw is a voltage sufficient for generating the hot electrons, which will differ in accordance with objectives and design, but may be about 2 V or more, preferably around 5 to 10 V. In the present embodiment, in a case in which writing of the logical value '10' is being carried out, +Vdw is set to 5 V, in a case in which writing of the logical value '01' is being carried out, +Vdw is set to 7.5 V, and in a case in which writing of the logical value '00' is being carried out, +Vdw is set to 10 V. Thus, the charge amount that is accumulated at the second charge accumulation portion 32 is larger for smaller logical values.

Meanwhile, the voltage value +Vgw is a voltage sufficient for enough carriers to be formed in the channel formation region 20 and for hot electrons generated in the vicinity of the drain region 18 to be injected into the second charge accumulation portion 32. The voltage value +Vgw will differ in accordance with objectives and design, but may preferably be around 3 to 12 V.

Thus, the memory cell 10 relating to the present embodiment can memorize four bits of data by memorizing two-bit data units at each of the first and second charge accumulation portions (30 and 32).

—Process for Reading Data—

Next, an operation for reading out information at the drain region 18 side is implemented by the following process.

When data at the drain region 18 side is to be read out, a positive voltage (+Vsr) is applied to the source region 16, a positive voltage (+Vgr) is applied to the gate electrode 24, and the drain region 18 is set to the ground voltage.

If charge (here, electrons) has been accumulated at the second charge accumulation portion 32 at the drain region 18 side, the larger the amount of charge that has been accumulated, the more a resistance of the second resistance variation portion 28 rises. As a result, a state in which it is more difficult to provide carriers to the channel formation region 20 arises, and an amount of charge that flows through the channel formation region 20 is reduced.

On the other hand, if the drain region 18 is still in the initial state with the literal value '11', no charge has been accumulated at the second charge accumulation portion 32. Therefore, resistance of the second resistance variation portion 28 is unchanged. As a result, carriers are supplied to the channel formation region 20 and a more substantial current flows in the channel formation region 20.

That is, by using differences in values of current that flows through the nMOSFET, it is possible to identify which of the logical values '00' to '11' has been written to the drain region 18 side.

—Process for Erasing Data—

Next, erasure of data at the drain region 18 side is carried out by the following process.

(a) If, for example, the memory cell 10 is employed as an OTPROM (one-time programmable read-only memory), an operation for writing one time as described above is final. However, it would be necessary to erase information which has been written at the time of a quality assurance test.

In such a case, with a view to canceling charge which has been accumulated at the second charge accumulation portion 32, illumination of ultraviolet radiation, heating processing (which may include standing in a high temperature atmosphere) or the like may be applied to the second charge accumulation portion 32 at the drain region 18 side of which a logical value '00' to '10' has been written. With such methods, separate installation of a circuit is not required for performing the electronic erasure, and the memory structure can be realized at low cost.

(b) It is also possible to form a structure at which electric erasure of information is possible, such as, for example, an EEPROM (electrically erasable and programmable ROM).

Accordingly, when charge has been accumulated at the second charge accumulation portion 32 for electrostatic charging (herein, a case in which any of the logical values '00' to '10' has been written), a positive voltage (+Vde) is applied to the drain region 18, zero or a negative voltage (−Vge) is applied to the gate electrode 24, and the source region 16 is set to an open state (alternatively referred to as a floating state).

In these conditions, hot holes which are generated at the edge of the drain region 18 are injected into the second charge accumulation portion 32. Hence, erasure of the information can be implemented by cancelling out charges that had been accumulated at the second charge accumulation portion 32 (here, electrons). The voltage +Vde at this time is a voltage sufficient to generate hot holes in the vicinity of the drain region 18, and may be 2 V or more, preferably in a range of around 4 to 10 V. Meanwhile, −Vge is a voltage which is applied in order to efficiently concentrate the hot holes at the edge of the second charge accumulation portion 32, and may be of the order of around −7 to 0 V.

Next, structure of a semiconductor non-volatile memory 100 relating to the present embodiment will be described below with reference to FIG. 3.

Figure 3:
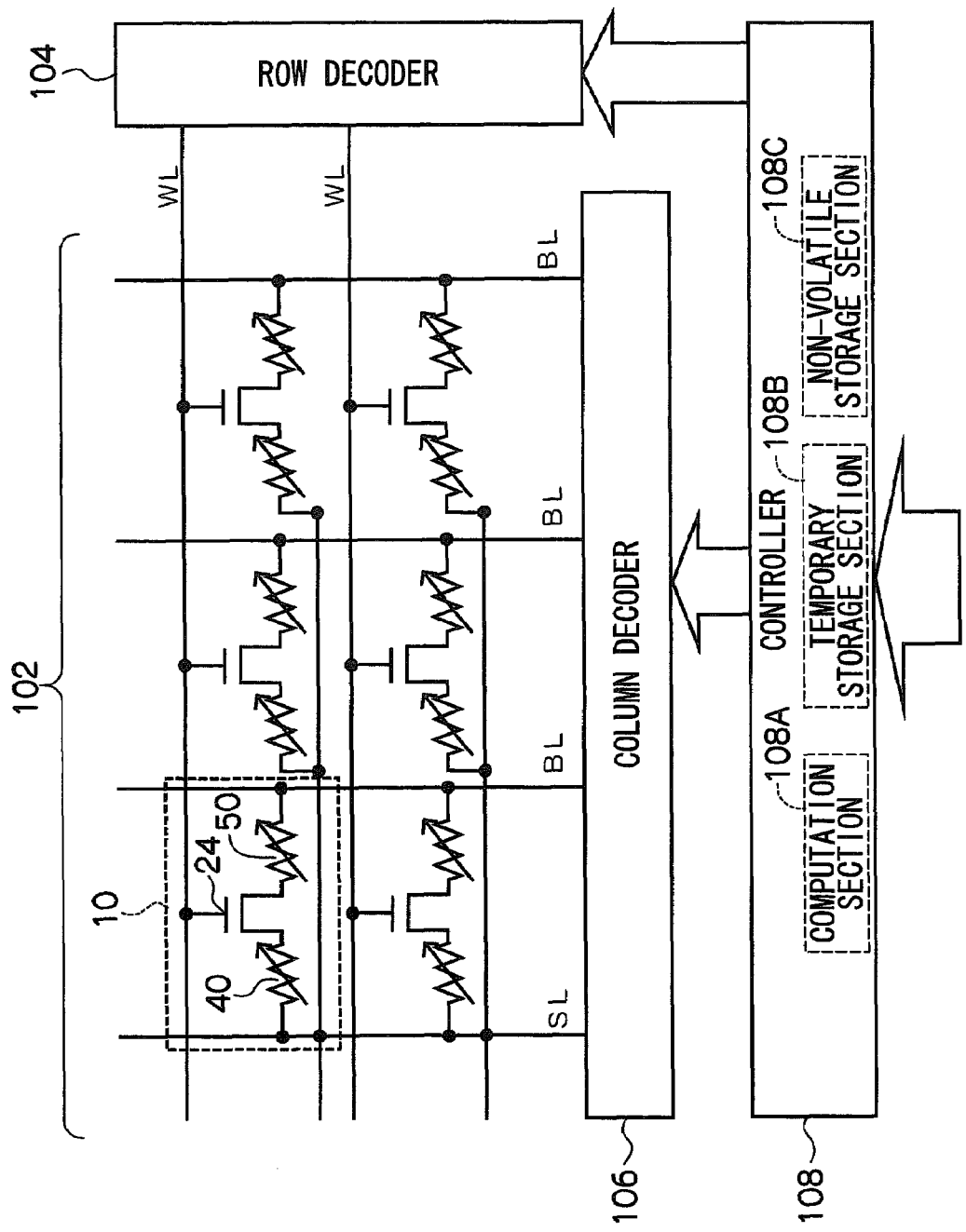
FIG. 3 is a structural diagram showing structure of a semiconductor non-volatile memory relating to the embodiment.

As shown in FIG. 3, the semiconductor non-volatile memory 100 is provided with a memory cell array 102. In the memory cell array 102, plural word lines WL provided in a first direction (a row direction) and plural bit lines BL in a second direction intersecting the first direction (i.e., a column direction) are intersectingly arrayed. The respective memory cells 10 are provided at intersections of the respective word lines WL and the respective bit lines BL.

The gate electrode 24 of each memory cell 10 is connected to a word line WL, and the drain region 18 of each memory cell 10 is connected to a bit line BL. The source regions 16 of all the memory cells 10 are connected to a common source line SL.

The word lines WL are connected to a row decoder 104, and the bit lines BL and the source line SL are connected to a column decoder 106. The row decoder 104 and the column decoder 106 are both connected to a controller 108.

The controller 108 is provided with a computation section 108A, a temporary storage section 108B and a non-volatile storage section 108C. The computation section 108A controls operations for memorizing and reading data at the memory cell array 102. The temporary storage section 108B temporarily memorizes data. The non-volatile storage section 108C stores various program storage mediums, such as a data-writing program storage medium which will be described later, and the like. When data is inputted from externally, the controller 108 executes the data-writing program storage medium. The controller 108 outputs row addresses representing row numbers of the word lines WL connected to the memory cells 10 that are memorization destinations of the data to the row decoder 104. The controller 108 also outputs two-bit data units which are memorization objects and column addresses representing column numbers of the bit lines BL connected to the memory cells 10 that are the memorization destinations of the data to the column decoder 106, and outputs instruction information which relates to voltages to be applied to the bit lines BL and the source line SL.

The row decoder 104 controls applications of voltages to the word lines WL corresponding to the inputted row addresses. The column decoder 106 controls applications of voltages to the bit lines BL and the source line SL in accordance with the inputted two-bit data units, the column addresses and the instruction information.

Next, operation of the semiconductor non-volatile memory 100 relating to the present embodiment will be described.

When data to be memorized to the memory cells 10 of the memory cell array 102 (in the present embodiment, data with a four-bit structure) and address data designating the memory cells 10 to be memorization destinations are inputted from outside, the controller 108 temporarily stores the data and the address data in the temporary storage section 108B, and executes the following data-writing program storage medium.

Figure 4:
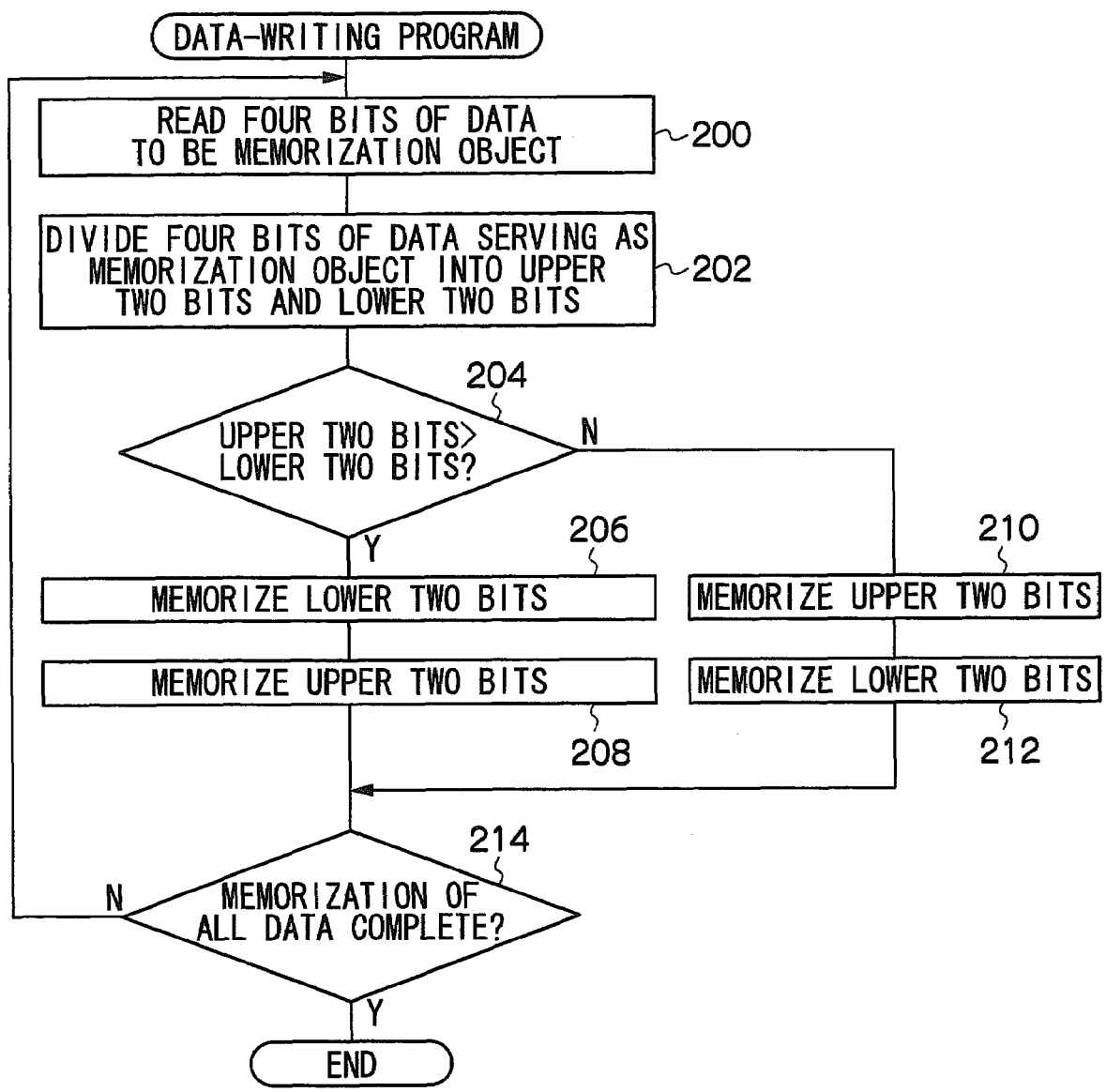
FIG. 4 is a flowchart showing a flow of processing of a data-writing program storage medium relating to a first embodiment.

FIG. 4 is a flowchart showing a flow of processing of the data-writing program storage medium which is executed by the controller 108. This program storage medium has been pre-memorized at the non-volatile storage section 108C.

In step 200, a four-bit data unit to be memorized to one of the memory cells 10 is read out from the temporary storage section 108B, in address order, to serve as a memorization object. Next, in step 202, the four bits of data which have been read out are divided into two upper bits and two lower bits of data.

Next, in step 204, the upper two-bit data unit and lower two-bit data unit which have been divided apart are compared, and if the upper two-bit data unit is larger, the processing advances to step 206. If the upper two-bit data unit is the same as the lower two-bit data unit or the lower two-bit data unit is larger, the processing advances to step 210.

In step 206, a row address representing a row number of the memory cell 10 that is to be the memorization destination of the data is outputted to the row decoder 104, the lower two-bit data unit and a column address representing a column number of the memory cell 10 that is to be the memorization destination of the data are outputted to the column decoder 106, and instruction information instructing earthing of the source line SL is outputted to the column decoder 106.

The row decoder 104 applies a positive voltage (+Vgw) to the word line WL of the row number designated by the row address.

The column decoder 106 applies a positive voltage (+Vdw) corresponding to the lower two-bit data unit to the bit line BL of the column number designated by the column address, and earths the source line SL.

Thus, the positive voltage corresponding to the lower two-bit data unit (+Vdw) is applied to the drain region 18 of the designated memory cell 10, a positive voltage (+Vgw) is applied to the gate electrode 24, and the source region 16 is set to the earth voltage. Thus, a charge corresponding to the lower two-bit data unit is accumulated at the second charge accumulation portion 32 of that memory cell 10.

Next, in step 208, the row address representing the row number of the memory cell 10 that is the memorization destination of the data is outputted to the row decoder 104, the upper two-bit data unit and the column address representing the column number of the memory cell 10 that is the memorization destination of the data are outputted to the column decoder 106, and instruction information instructing a supply of voltage to the source line SL is outputted to the column decoder 106.

The row decoder 104 applies a positive voltage (+Vgw) to the word line WL of the row number designated by the row address.

The column decoder 106 earths the bit line BL of the column number designated by the column address, and applies a positive voltage (+Vdw) corresponding to the upper two-bit data unit to the source line SL.

Thus, the positive voltage corresponding to the upper two-bit data unit (+Vdw) is applied to the source region 16 of the designated memory cell 10, a positive voltage (+Vgw) is applied to the gate electrode 24, and the drain region 18 is set to the earth voltage. Thus, a charge corresponding to the upper two-bit data unit is accumulated at the first charge accumulation portion 30 of that memory cell 10.

On the other hand, in step 210, similarly to step 208, the row address representing the row number of the memory cell 10 that is to be the memorization destination of the data is outputted to the row decoder 104, the upper two-bit data unit and the column address representing the column number of the memory cell 10 that is to be the memorization destination of the data are outputted to the column decoder 106, and instruction information instructing the supply of voltage to the source line SL is outputted to the column decoder 106.

Hence, a charge corresponding to the upper two-bit data unit is accumulated at the first charge accumulation portion 30 of the designated memory cell 10.

Next, in step 212, similarly to step 206, the row address representing the row number of the memory cell 10 that is the memorization destination of the data is outputted to the row decoder 104, the lower two-bit data unit and the column address representing the column number of the memory cell 10 that is the memorization destination of the data are outputted to the column decoder 106, and instruction information instructing earthing of the source line SL is outputted to the column decoder 106.

Hence, a charge corresponding to the lower two-bit data unit is accumulated at the second charge accumulation portion 32 of the designated memory cell 10.

Then, in step 214, it is judged whether or not memorization of all data has been completed. While this judgement is negative, the processing returns to step 200, and when this judgement is positive, the processing of the present data-writing program ends.

Figure 5A:
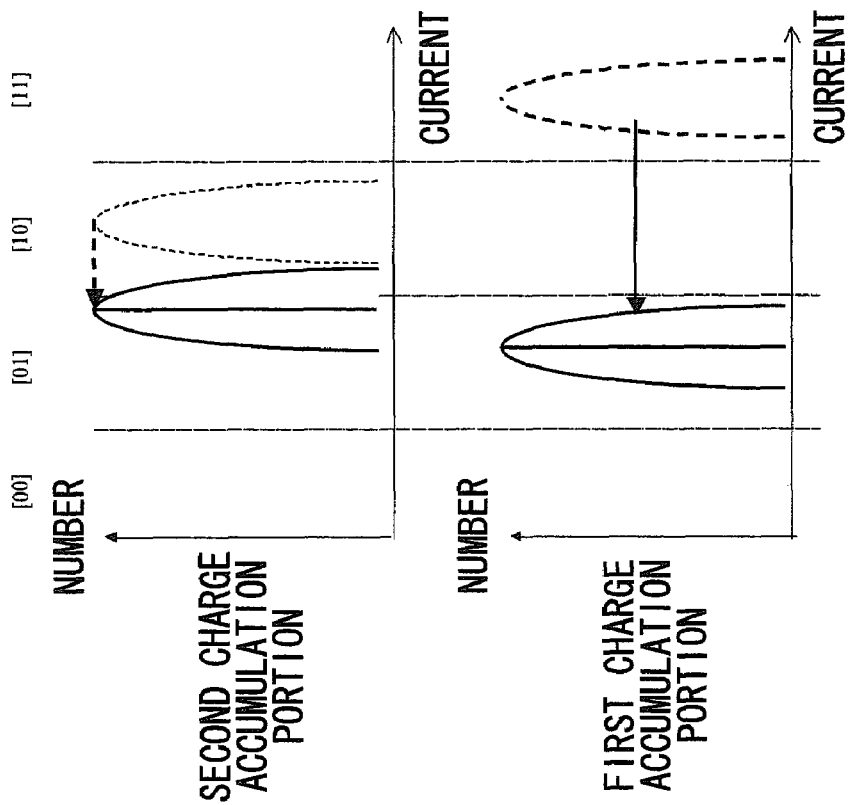
FIG. 5A is graphs showing numbers of memory cells detected for each of current values when data units are memorized in ascending order of charge amounts to be accumulated and the data units are read out.
Figure 5B:
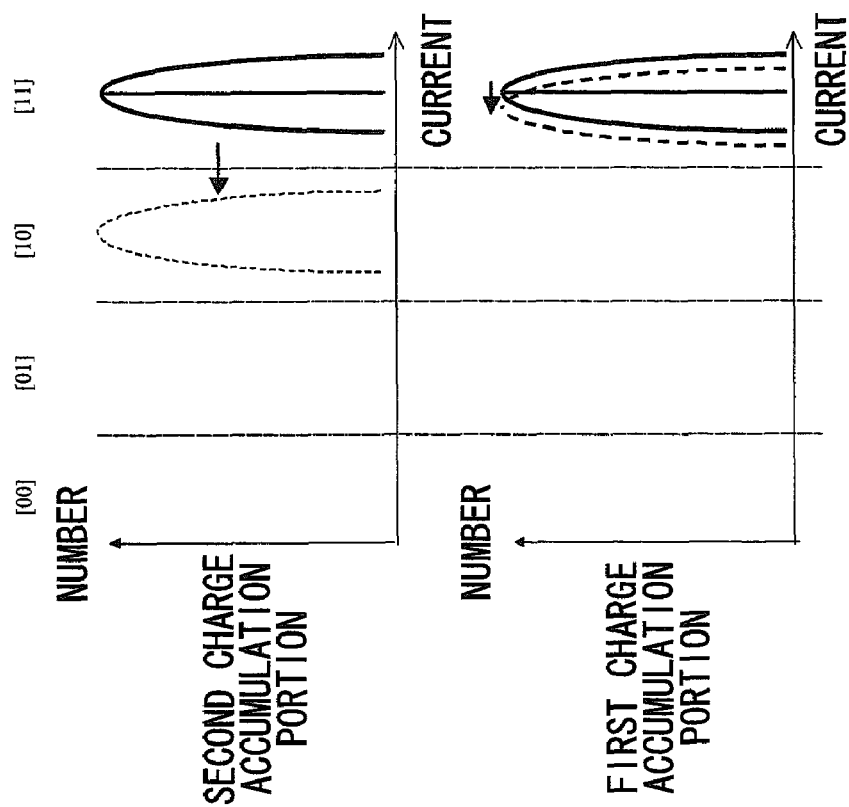
FIG. 5B is graphs showing numbers of memory cells detected for each of current values when the data units are memorized in ascending order of the charge amounts to be accumulated and the data units are read out.

FIG. 5A and FIG. 5B show numbers of the memory cells 10 for each of current values which are detected when data units are memorized to the first and second charge accumulation portions (30 and 32) of the memory cells 10 in ascending order of charge amounts that are to be accumulated and the data units are then read out. FIG. 5A shows a state in which data units with the logical value '10' have been memorized at the second charge accumulation portions 32 of the memory cells 10, and FIG. 5B shows a state in which data units with the logical value '01' have then been memorized at the first charge accumulation portions 30 of the memory cells 10.

As shown in FIG. 5A, when the writing of data units with the logical value '10' to the second charge accumulation portions 32 is carried out, the first charge accumulation portions 30 are also lightly written and charges are accumulated thereat. In consequence, the current values that are detected when the data units memorized at the first charge accumulation portions 30 of the memory cells 10 are read out change as shown by the broken line.

Further, as shown in FIG. 5B, when the writing of data units with the logical value '01' to the first charge accumulation portions 30 is carried out, the second charge accumulation portions 32 are also lightly written, in accordance with the charge amounts being accumulated at the first charge accumulation portions 30, and charges are accumulated at the second charge accumulation portions 32. In consequence, the current values that are detected when the data units memorized at the second charge accumulation portions 32 of the memory cells 10 are read out change as shown by the solid line. Thus, when writing in which a charge amount to be accumulated is large is carried out, power that is provided to the memory cell 10 is large, and a data unit that has been memorized to another charge accumulation section in the same memory cell 10 may be altered as a result.

Figure 6B:
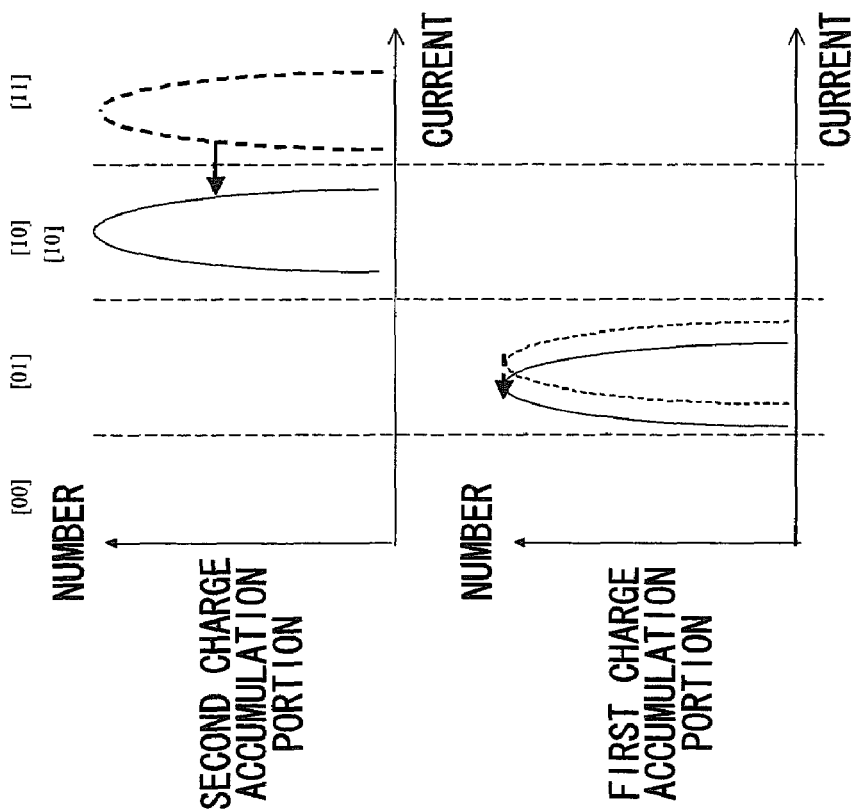
FIG. 6B is graphs showing numbers of memory cells detected for each of current values when the data units are memorized by the data memorization processing relating to the first embodiment and the data units are read out.
Figure 6A:
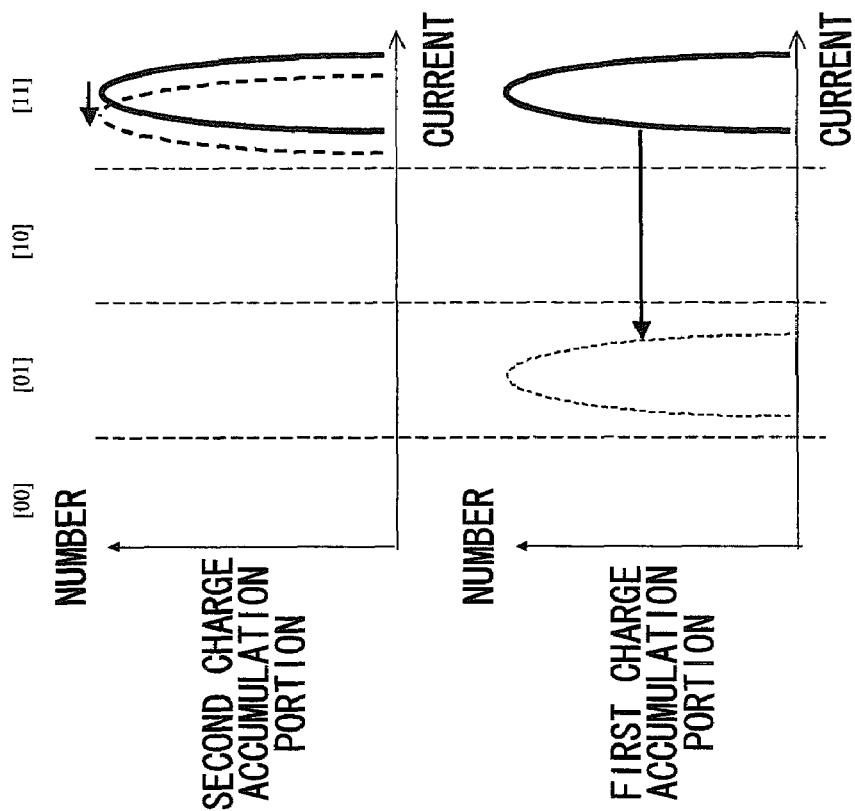
FIG. 6A is graphs showing numbers of memory cells detected for each of current values when data units are memorized by data memorization processing relating to the first embodiment and the data units are read out.

In contrast, FIG. 6A and FIG. 6B show numbers of the memory cells 10 for each of current values which are detected when data units are memorized to the first and second charge accumulation portions (30 and 32) of the memory cells 10 in descending order of charge amounts that are to be accumulated, in accordance with the data memorization processing relating to the present embodiment, and the data units are read out.

As shown in FIG. 6A, when the writing of data units with the logical value '01' to the first charge accumulation portions 30 is carried out, the second charge accumulation portions 32 are also lightly written and charges are accumulated thereat. In consequence, the current values that are detected when the data units memorized at the second charge accumulation portions 32 of the memory cells 10 are read out change as shown by the broken line.

Further, as shown in FIG. 6B, when the writing of data units with the logical value '10' to the second charge accumulation portions 32 is carried out, the first charge accumulation portions 30 are also lightly written, in accordance with the charge amounts being accumulated at the second charge accumulation portions 32. In consequence, the current values that are detected when the data units memorized at the first charge accumulation portions 30 of the memory cells 10 are read out change as shown by the solid line. Because the increase in charge amounts due to the writing to the second charge accumulation portions 32 is small, an amount of change of the detected current values can be kept small.

Thus, according to the present embodiment, power is provided to the first and second charge accumulation portions (30 and 32) of the memory cell 10 in accordance with the data units which are objects of memorization and the data units are memorized by charges being accumulated at the first and second charge accumulation portions (30 and 32), in descending order of the charge amounts that are to be accumulated. Therefore, an increase, due to an operation of memorizing data to a charge accumulation portion, in charge at another charge accumulation portion in the same memory cell can be suppressed, and consequently a change in data that has been memorized at the other charge accumulation section can be suppressed.

Second Embodiment

Next, an exemplary embodiment will be described in which a charge amount accumulated at a charge accumulation portion is controlled so as to be smaller than a charge amount corresponding to the data that is to be memorized. Structure of the memory cell 10 and structure of the semiconductor non-volatile memory 100 relating to the second embodiment are the same as in FIG. 1 to FIG. 3, so will not be described here.

Figure 7:
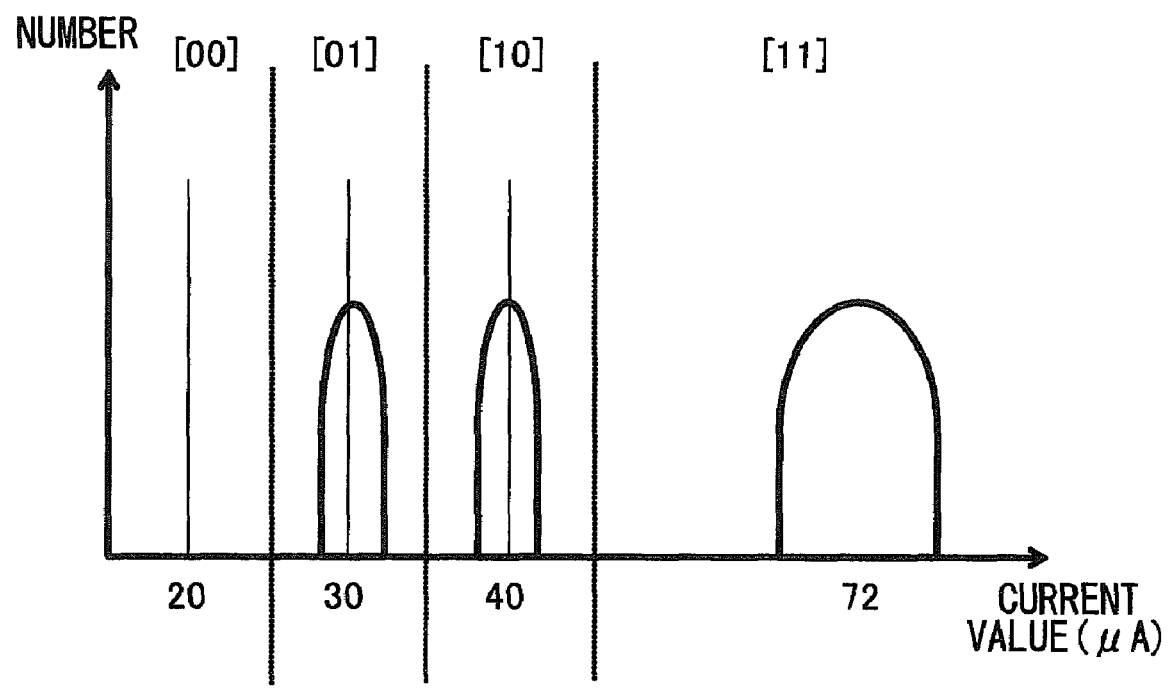
FIG. 7 is a graph showing data units which are memorized to the semiconductor non-volatile memory relating to the embodiment and current values which are detected when the data units are read out.

As shown in FIG. 7, the semiconductor non-volatile memory 100 relating to the present embodiment has a structure in which a current value that is detected when a two-bit data unit has been memorized at a charge accumulation portion and the data unit is read out is 20 µA for the logical value '00', 30 µA for the logical value '01', 40 µA for the logical value '10' and 72 µA for the logical value '11'.

Figure 8A:
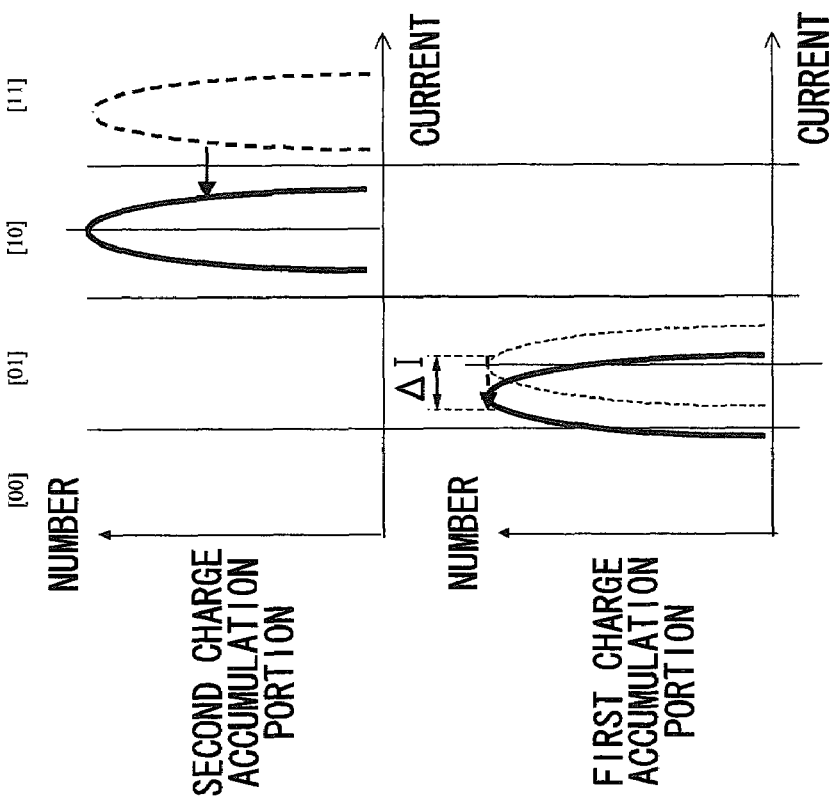
FIG. 8A is graphs showing numbers of memory cells detected for each of current values when predetermined data units are memorized at first and second charge accumulation portions and the data units are read out.
Figure 8B:
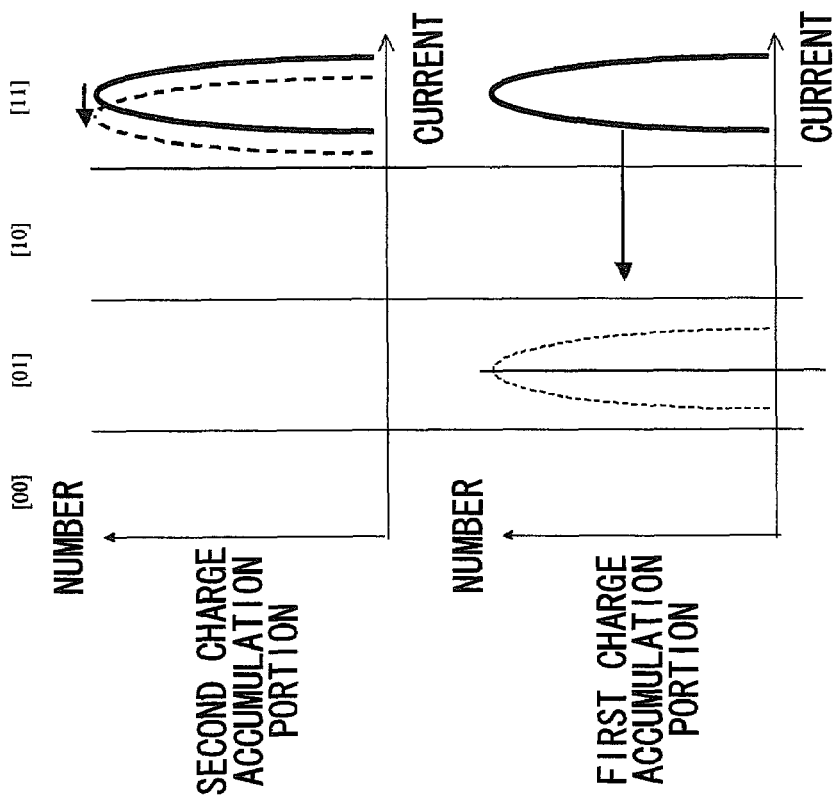
FIG. 8B is graphs showing numbers of memory cells detected for each of current values when the predetermined data units are memorized at the first and second charge accumulation portions and the data units are read out.

For example, after writing of a data unit with the logical value '01' to the first charge accumulation portions 30 has been carried out as shown in FIG. 8A, writing of a data unit with the logical value '10' to the second charge accumulation portions 32 is carried out as shown in FIG. 8B. At such a time, the first charge accumulation portions 30 are also weakly written and charges are accumulated thereat. In consequence, the current values that are detected when the data units which have been memorized to the first charge accumulation portions 30 are read out change as shown by the solid line. An amount of change of the current values (ΔI) differs for each kind of data unit formerly written to the first charge accumulation portions 30 and each kind of data unit latterly written to the second charge accumulation portions 32.

Figure 9:
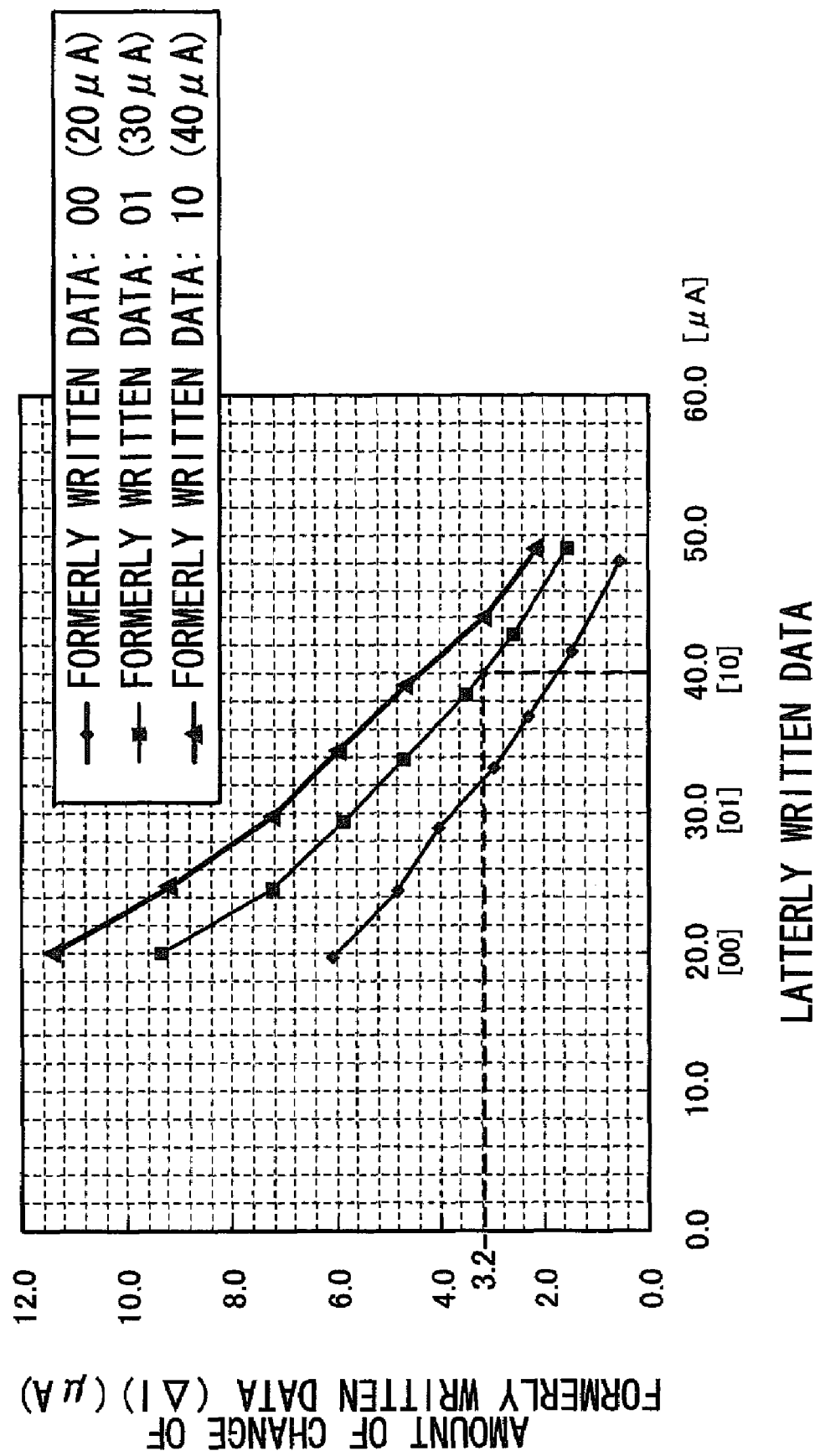
FIG. 9 is a graph showing relationships between an amount of change in a current value (ΔI) and data units written to charge accumulation portions.

FIG. 9 shows amounts of change in current values (ΔI) due to latter data-writing for each kind of data unit being formerly written. For example, if the logical value of a data unit that is formerly written to the first charge accumulation portion 30 is '01' and the logical value of a data unit that is latterly written to the second charge accumulation portion 32 is '10' (40 µA), an amount of change in the current value that is detected when the data unit which has been memorized to the first charge accumulation portion 30 is read out is 3.2 µA.

At the controller 108 relating to the present embodiment, for each kind of data unit that is written formerly, correction amounts are pre-memorized at the non-volatile storage section 108C as correction information. The correction information is for reducing a voltage that is applied so as to reduce a charge amount that is formerly written, by an amount corresponding to the amount of change in the current value according to the kind of data unit that is to be latterly written.

Figure 10:
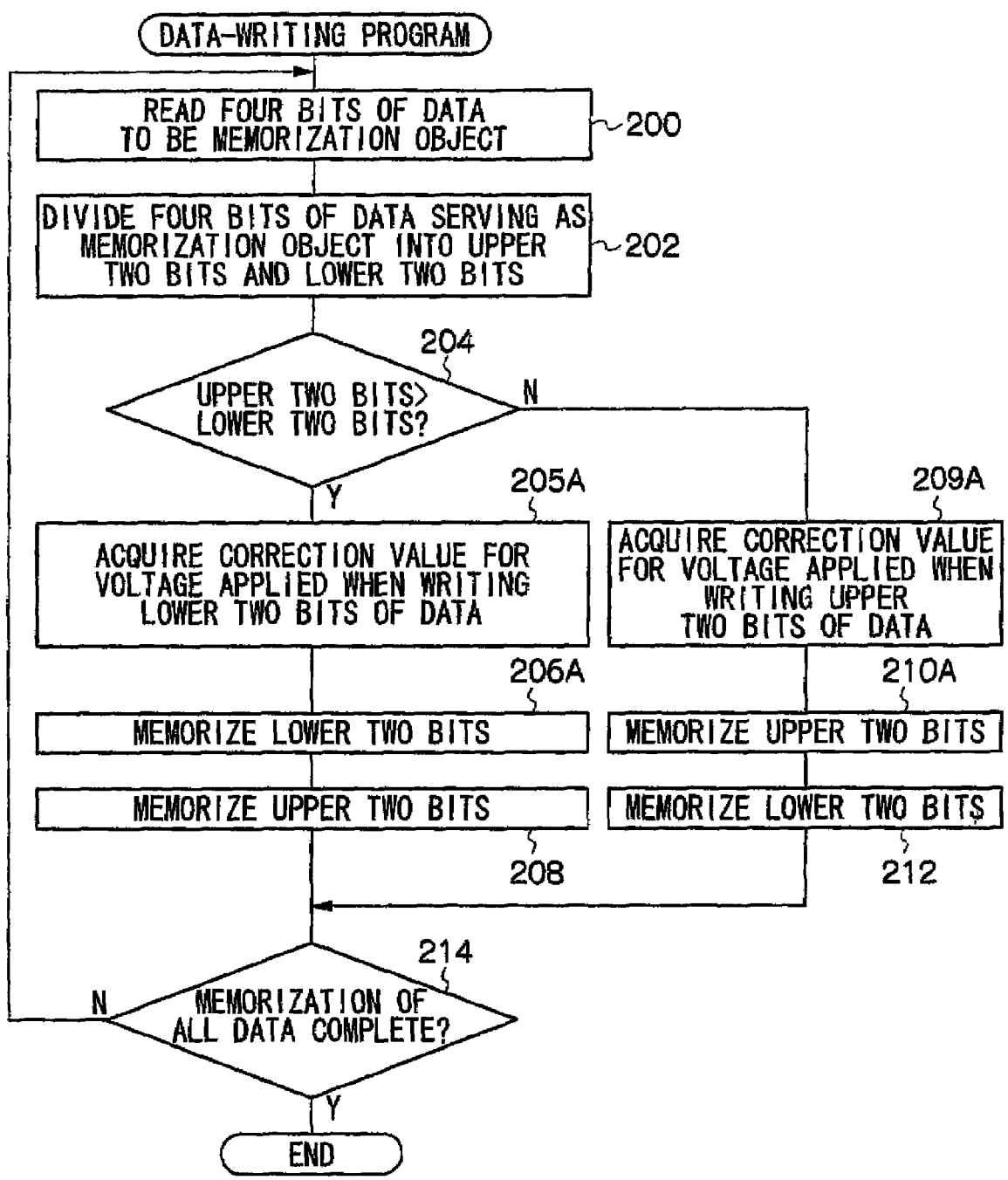
FIG. 10 is a flowchart showing a flow of processing of a data-writing program storage medium relating to a second embodiment.

FIG. 10 is a flowchart showing a flow of processing of a data-writing program storage medium which is executed by the controller 108. Processing that is the same in FIG. 10 as in the data-writing program storage medium relating to the first embodiment (FIG. 4) is assigned the same reference numerals and will not be described here, while processing that differs will be described with "A" appended to the reference numerals.

In step 205A, correction information is read from the non-volatile storage section 108C, with the lower two-bit data unit being the data unit to be written formerly and the upper two-bit data unit being the data unit to be written latterly.

Then, in step 206A, the row address representing the row number of the memory cell 10 that is to be the memorization destination of the data is outputted to the row decoder 104, the lower two-bit data unit, the correction information and the column address representing the column number of the memory cell 10 that is to be the memorization destination of the data are outputted to the column decoder 106, and instruction information instructing earthing of the source line SL is outputted to the column decoder 106.

The row decoder 104 applies a positive voltage (+Vgw) to the word line WL of the row number designated by the row address.

The column decoder 106 applies a voltage to the bit line BL of the column number designated by the column address, which voltage is a voltage corresponding to the lower two-bit data unit reduced by the correction amount indicated by the correction information, and the column decoder 106 earths the source line SL.

Thus, the corrected voltage is applied to the drain region 18 of the designated memory cell 10, a positive voltage (+Vgw) is applied to the gate electrode 24, and the source region 16 is set to the earth voltage. Hence, charge is accumulated at the second charge accumulation portion 32 of that memory cell 10. At this time, because the voltage applied to the drain region 18 is lowered by the correction, the charge amount that is accumulated at the second charge accumulation portion 32 is smaller than a charge amount corresponding to the lower two-bit data unit.

On the other hand, in step 209A, correction information is read from the non-volatile storage section 108C, with the upper two-bit data unit being the data to be written formerly and the lower two-bit data unit being the data to be written latterly.

Then, in step 210A, the row address representing the row number of the memory cell 10 that is to be the memorization destination of the data is outputted to the row decoder 104, the upper two-bit data unit, the correction information and the column address representing the column number of the memory cell 10 that is to be the memorization destination of the data are outputted to the column decoder 106, and instruction information instructing the supply of voltage to the source line SL is outputted to the column decoder 106.

The row decoder 104 applies a positive voltage (+Vgw) to the word line WL of the row number designated by the row address.

The column decoder 106 earths the bit line BL of the column number designated by the column address and applies a voltage, which is a voltage corresponding to the upper two-bit data unit reduced by the correction amount indicated by the correction information, to the source line SL.

Thus, the corrected voltage is applied to the source region 16 of the designated memory cell 10, a positive voltage (+Vgw) is applied to the gate electrode 24, and the drain region 18 is set to the earth voltage. Hence, charge is accumulated at the first charge accumulation portion 30 of that memory cell 10. At this time, because the voltage applied to the source region 16 is lowered by the correction, the charge amount that is accumulated at the first charge accumulation portion 30 is smaller than a charge amount corresponding to the upper two-bit data unit.

Figure 11A:
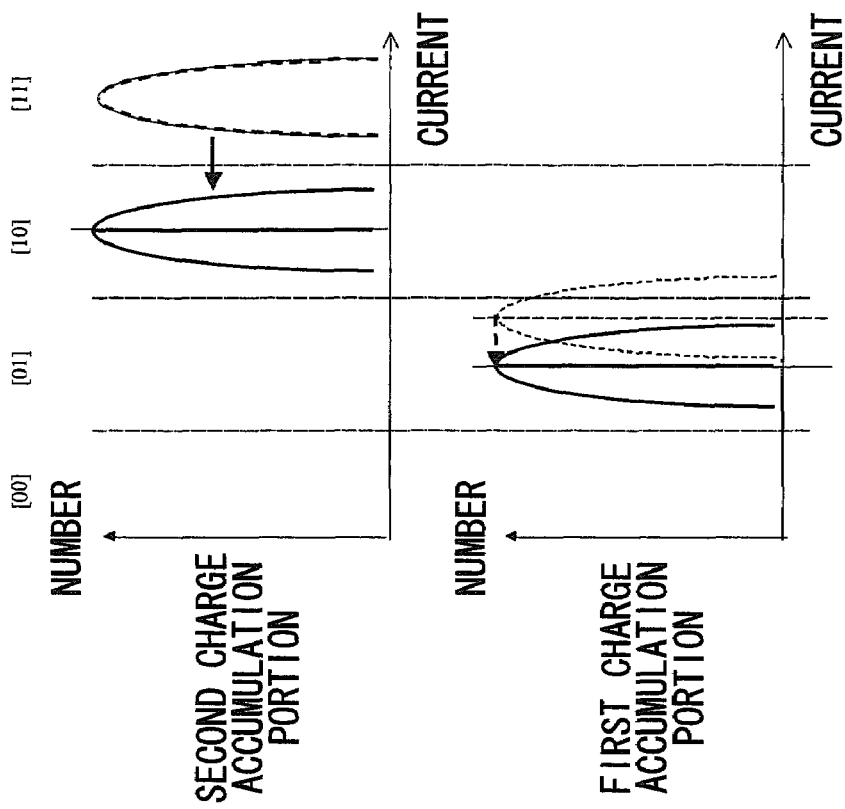
FIG. 11A is graphs showing numbers of memory cells detected for each of current values when data units are memorized by data memorization processing relating to the second embodiment and the data units are read out.
Figure 11B:
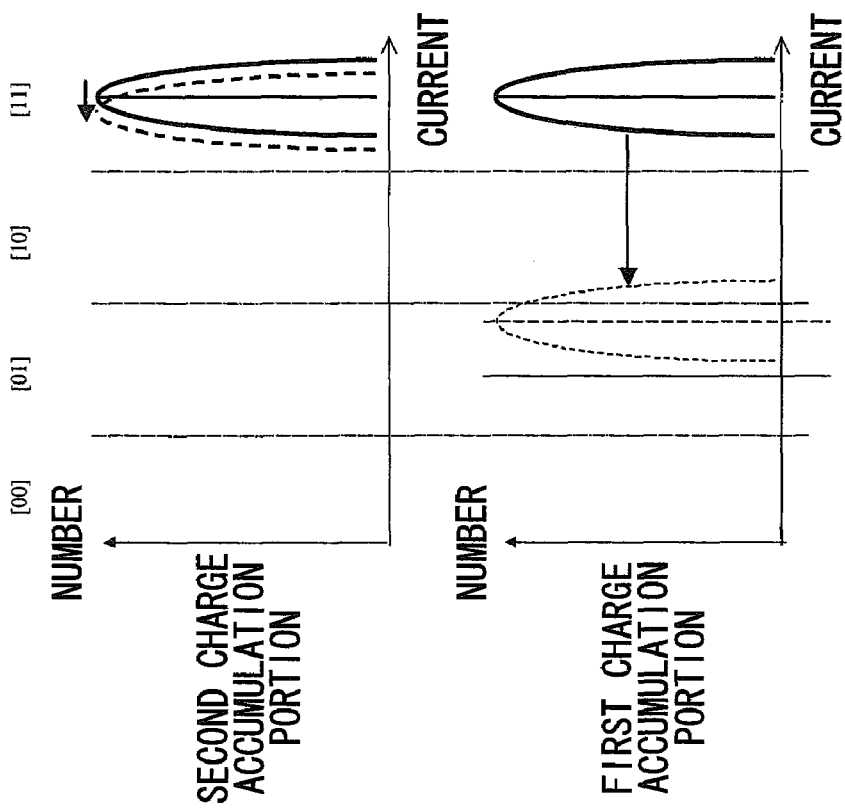
FIG. 11B is graphs showing numbers of memory cells detected for each of current values when the data units are memorized by the data memorization processing relating to the second embodiment and the data units are read out.

FIG. 11A and FIG. 11B show numbers of memory cells for each of current values which are detected when data units have been memorized to the first and second charge accumulation portions (30 and 32) of the memory cells 10 by the data memorization processing relating to the present embodiment and the data units are read out.

As shown in FIG. 11A, writing of data units with the logical value '01' to the first charge accumulation portions 30 is carried out formerly. Because the accumulated charge amounts are made smaller, current values that are detected when the data units which have been written to the first charge accumulation portions 30 are read out are larger than a value corresponding to a data unit with the logical value '01'.

Then, as shown in FIG. 11B, writing of data units with the logical value '10' to the second charge accumulation portions 32 of the memory cells 10 is carried out. At this time, because weak writing is also applied to the first charge accumulation portions 30 in accordance with the charge amounts that are being accumulated at the second charge accumulation portions 32, current values that are detected when the data units which have been written to the first charge accumulation portions 30 are read out come to the value corresponding to the data unit with the logical value '01'.

As described above, according to the present embodiment, a charge amount which is formerly accumulated at a charge accumulation portion is made smaller than a charge amount corresponding to the data unit that is to be memorized. Hence, writing which occurs when a data unit is latterly being written to the other charge accumulation portion in the same memory cell can adjust the accumulated charge amount to the charge amount corresponding to the data unit to be memorized.

Moreover, according to the present embodiment, because the charge amount that is accumulated at each charge accumulation portion is made smaller by an amount corresponding to an increase in the charge amount due to data subsequently being memorized, the charge amount that is accumulated at each charge accumulation portion can be set to a charge amount corresponding to the data unit thereof when the data to be memorized subsequently is written.

Further, in a case in which the data units to be memorized at the first and second charge accumulation portions (30 and 32) are the same, the data units are memorized in a pre-specified sequence (in the present embodiment, the first charge accumulation portion 30 and then the second charge accumulation portion 32), with a charge amount being set smaller for the data unit that is earlier in the sequence. Thus, when matching data units are being memorized, alteration by a data memorization operation of a data unit that has previously been memorized can be suppressed.

Herein, for the first and second embodiments, a case in which two charge accumulation portions are provided at the memory cell 10 has been described. However, the present invention is not limited thus. It is also possible to apply the present invention to a memory cell 10 at which three or more charge accumulation portions are provided.

Further, for the first and second embodiments, a case has been described of writing the memory cells 10 one by one, starting each memory cell 10 with the data unit for which the charge amount to be accumulated is larger. However, the present invention is not limited thus. For example, it is possible to divide data inputted from outside into the data units to be memorized at the charge accumulation portions (two-bit units in the present embodiments), and then memorize the data units to the charge accumulation portions of the memory cells 10 in a sequence starting with data units for which the charge amount to be accumulated is largest. In such a case, the same effects can be realized as with the present embodiments.

Further, for the first and second embodiments, a case has been described in which the controller 108 is incorporated at the semiconductor non-volatile memory 100. However, the present invention is not limited thus. For example, rather than incorporating the controller 108 at the semiconductor non-volatile memory 100, data may be written to the first and second charge accumulation portions (30 and 32) of the memory cells 10 by the row decoder 104 and the column decoder 106 being controlled by a controller provided at an external apparatus. In such a case, the same effects can be realized as with the present embodiments.

Further, a case has been described for the second embodiment in which the correction information is pre-memorized at the non-volatile storage section 108C. However, the present invention is not limited thus. For example, correction values may be calculated using a function which is pre-memorized at the non-volatile storage section 108C, input values of the function being the data unit to be written formerly and the data unit to be written latterly and an output value being a correction value for reducing a voltage that is applied. In such a case, the same effects can be realized as with the present embodiments.

Furthermore, the structure of the memory cell 10 described for the first embodiment (see FIG. 1 and FIG. 2) and the structure of the semiconductor non-volatile memory 100 (see FIG. 3) are examples, and obviously suitable modifications are possible within a scope not departing from the spirit of the present invention.

Further, the flow of processing of the data-writing program storage mediums described for the first and second embodiments (see FIG. 4 and FIG. 10) is an example, and obviously suitable modifications are possible within a scope not departing from the spirit of the present invention.

Further, the graphs showing numbers of memory cells for each of current values detected when data units which have been memorized to the first and second charge accumulation portions (30 and 32) described for the present embodiments are read out (see FIG. 5A, FIG. 5B, FIG. 6A, FIG. 6B, FIG. 8A, FIG. 8B, FIG. 11A and FIG. 11B), the graph showing memorized data units and current values that are detected when the data units are read (see FIG. 7), and the graph showing relationships between current value alteration amounts ($\Delta I$) and written data units (see FIG. 9) are obviously examples.

What is claimed is:

1. A non-volatile semiconductor memory comprising:
   a memory cell at which a charge accumulation portion capable of accumulating charge is plurally provided;
   a power supply section that supplies power in accordance with each of data units of pluralities of bits, which data units are respective objects of memorization at the charge accumulation portions, and causes the each data unit to be memorized by charge being accumulated at the respective charge accumulation portion in a charge amount corresponding to the data unit; and
   a control section that controls the power supply section such that the data units are memorized at the charge accumulation portions in descending order of the charge amounts to be accumulated.

2. The non-volatile semiconductor memory of claim 1, wherein the control section controls the power supply section such that, when the data unit that is being memorized is earlier in the order, a charge amount that is accumulated at the charge accumulation portion is smaller than the charge amount corresponding to the data unit.

3. The non-volatile semiconductor memory of claim 1, wherein the control section controls the power supply section such that when one of the data units is being memorized to the respective charge accumulation portion, a charge amount that is accumulated at the respective charge accumulation portion is reduced by an amount corresponding to an increase in the charge amount due to another of the data units subsequently being memorized.

4. The non-volatile semiconductor memory of claim 2, wherein the control section controls the power supply section such that when one of the data units is being memorized to the respective charge accumulation portion, a charge amount that is accumulated at the respective charge accumulation portion is reduced by an amount corresponding to an increase in the charge amount due to another of the data units subsequently being memorized.

5. The non-volatile semiconductor memory of claim 1 wherein, if the data units to be memorized at the respective charge accumulation portions are the same as one another, the control section controls the power supply section such that the data units are memorized in a pro-specified order with a charge amount being smaller when the data unit that is being memorized is earlier in the order.

6. The non-volatile semiconductor memory of claim 2 wherein, if the data units to be memorized at the respective charge accumulation portions are the same as one another, the control section controls the power supply section such that the data units are memorized in a pre-specified order with a charge amount being smaller when the data unit that is being memorized is earlier in the order.

7. A non-volatile semiconductor memory comprising:
   a memory cell at which a charge accumulation portion capable of accumulating charge is plurally provided;
   a power supply section that supplies power in accordance with each of data units of pluralities of bits, which data units are respective objects of memorization at the charge accumulation portions, and causes the each data unit to be memorized by charge being accumulated at the respective charge accumulation portion in a charge amount corresponding to the data unit; and
   a control section that, if the data units to be memorized at the respective charge accumulation portions are the same as one another, controls the power supply section such that the data units are memorized in a pre-specified order with a charge amount being smaller when the data unit that is being memorized is earlier in the order.

8. A non-volatile semiconductor memory comprising:
   a memory cell having a plurality of charge accumulation portions that accumulate charge;
   a power supply section that supplies power to the charge accumulation portions to respectively write data units each of a plurality of bits into the charge accumulation portions as accumulated charge; and a control section that controls the power supply section, such that the data units are written into the charge accumulation portions in descending order of charge amount.

9. The non-volatile semiconductor memory of claim 8, wherein the control section controls the power supply section such that when a first of the data units that is being written is earlier in order, an actual charge amount that is accumulated at a corresponding one of the charge accumulation portions is smaller than a charge amount designated for the first data unit.

10. The non-volatile semiconductor memory of claim 8, wherein the control section controls the power supply section such that when one of the data units is written into a respective one of the charge accumulation portions, the charge amount that is accumulated at the respective one of the charge accumulation portions is reduced by an amount corresponding to an increase in the charge amount due to another of the data units to be subsequently written into another one of the charge accumulation portions.

11. The non-volatile semiconductor memory of claim 9, wherein the control section controls the power supply section such that when one of the data units is written into a respective one of the charge accumulation portions, the charge amount that is accumulated at the respective one of the charge accumulation portions is reduced by an amount corresponding to an increase in the charge amount due to another of the data units to be subsequently written into another one of the charge accumulation portions.

12. The non-volatile semiconductor memory of claim 8, wherein when the data units to be written into the plural charge accumulation portions are the same, the control section controls the power supply section such that the data units are written in a pre-specified order with the charge amount of the data unit that is written earlier in the pre-specified order being smaller.

13. The non-volatile semiconductor memory of claim 9, wherein when the data units to be written into the plural charge accumulation portions are the same, the control section controls the power supply section such that the data units are written in a pre-specified order with the charge amount of the data unit that is written earlier in the pre-specified order being smaller.

* * * * *